United States Patent
Hong (10) Patent No.: US 11,972,833 B2
(45) Date of Patent: *Apr. 30, 2024

(54) CALIBRATION CIRCUIT AND SEMICONDUCTOR DEVICE INCLUDING THE SAME

(71) Applicant: SK hynix Inc., Gyeonggi-do (KR)

(72) Inventor: Yun Gi Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 198 days.

This patent is subject to a terminal disclaimer.

(21) Appl. No.: 17/732,439

(22) Filed: Apr. 28, 2022

(65) Prior Publication Data
US 2022/0254389 A1    Aug. 11, 2022

Related U.S. Application Data

(63) Continuation of application No. 17/350,720, filed on Jun. 17, 2021, now Pat. No. 11,335,386.

(30) Foreign Application Priority Data

Dec. 14, 2020    (KR) .......... 10-2020-0174211

(51) Int. Cl.
G11C 7/10    (2006.01)
H03K 19/00    (2006.01)

(52) U.S. Cl.
CPC ....... *G11C 7/1048* (2013.01); *H03K 19/0005* (2013.01); *G11C 2207/2254* (2013.01)

(58) Field of Classification Search
None
See application file for complete search history.

(56) References Cited

U.S. PATENT DOCUMENTS 11,335,386 B1 *  5/2022  Hong .............. G11C 29/50008

* cited by examiner

*Primary Examiner* — Guerrier Merant
(74) *Attorney, Agent, or Firm* — IP & T GROUP LLP (57) ABSTRACT

A semiconductor device which includes a termination circuit coupled to a first pad and suitable for providing a termination resistance according to a first control code and a second control code during a normal operation in which data are input and output through the first pad; a stress replica circuit suitable for replicating a stress applied to the termination circuit during the normal operation and for generating a detection code during a second calibration mode; a first calibration circuit suitable for adjusting the first control code to match an impedance of a resistor part coupled to a second pad to an external resistor during a first calibration mode; and a second calibration circuit suitable for generating the second control code by adjusting the first control code according to the detection code during the second calibration mode.

8 Claims, 9 Drawing Sheets

|          | READ OPERATION (Ron) | WRITE OPERATION (Rtt) |
|----------|----------------------|------------------------|
| ODT_ENB1 | "H"                  | "H"                    |
| ODT_ENB2 | "H"                  | "L"                    |

CALIBRATION CIRCUIT AND SEMICONDUCTOR DEVICE INCLUDING THE SAME

CROSS-REFERENCE TO RELATED APPLICATION

This application is a continuation of U.S. patent application Ser. No. 17/350,720 filed on Jun. 17, 2021, which claims benefits of priority of Korean Patent Application No. 10-2020-0174211 filed on Dec. 14, 2020. The disclosure of each of the foregoing application is incorporated herein by reference in its entirety.

BACKGROUND

1. Field

The disclosure relates to semiconductor design technology, and specifically, to a semiconductor device including an on-die termination circuit and a calibration circuit.

2. Description of the Related Art

In semiconductor devices, the swing width of signals is decreasing so as to minimize a transmission time of signals interfacing between the semiconductor devices. As the swing width of the signals decreases, an effect of external noise on the semiconductor devices increases, and signal reflection that may be caused by impedance mismatching in an interface becomes a serious issue. If impedance mismatch occurs, it may be difficult to transmit data at a high speed, and data output from an output terminal of a semiconductor device may be distorted. Accordingly, since the semiconductor device receiving the data receives a distorted output signal, concerns such as a setup/hold failure, misjudgment, or the like may frequently occur.

In order to address these concerns, the semiconductor device required to operate at a high speed includes an impedance matching circuit, which is called an on-die termination circuit, installed adjacent to a pad within an integrated circuit (IC) chip. In general, for on-die termination schemes between a transmitter and a receiver, a source termination is performed by an output circuit in the transmitter, and a parallel termination is performed by a termination circuit that is coupled in parallel to an input circuit coupled to an input pad in the receiver. Signal integrity (SI) characteristics may be improved by an on-die termination circuit.

The semiconductor device may include a calibration circuit for generating a termination control code to adjust resistance or impedance of the on-die termination circuit. The calibration circuit performs a calibration operation for generating the termination control code that is varying depending on Process, Voltage, and Temperature (PVT) conditions. This is generally referred to as a ZQ calibration operation.

Meanwhile, the on-die termination circuit includes a plurality of pull-up transistors and/or pull-down transistors. Since the transistors are subjected to various types of stress depending on the operation of the semiconductor device, which may lead to signal distortion as impedance matching characteristics are degraded.

SUMMARY

Various exemplary embodiments are directed to a calibration circuit capable of generating a termination control code suitable for transistors that are deteriorated due to various stress such as negative bias temperature instability (NBTI), in a termination circuit, and a semiconductor device including the same.

According to an embodiment, a semiconductor device includes a termination circuit coupled to a first pad and suitable for providing a termination resistance according to a first control code and a second control code during a normal operation in which data are input and output through the first pad; a stress replica circuit suitable for replicating a stress applied to the termination circuit during the normal operation and for generating a detection code during a second calibration mode; a first calibration circuit suitable for adjusting the first control code to match an impedance of a resistor part coupled to a second pad to an external resistor during a first calibration mode; and a second calibration circuit suitable for generating the second control code by adjusting the first control code according to the detection code during the second calibration mode.

According to an embodiment, a semiconductor device includes at least one first pull-up resistor group coupled to a first pad and suitable for providing a first impedance according to a first pull-up control code during a read operation; at least one second pull-up resistor group coupled to the first pad and suitable for providing a second impedance according to a second pull-up control code during any of the read operation and a write operation; a stress replica circuit suitable for replicating a stress applied to the second pull-up resistor group during the write operation and for generating a detection code during a second calibration mode; and a calibration circuit suitable for adjusting the first pull-up control code to match an impedance of a pull-up resistor part coupled to a second pad to an external resistor during a first calibration mode and for generating the second pull-up control code by adjusting the first pull-up control code according to the detection code during the second calibration mode.

According to an embodiment, a semiconductor system includes is a first semiconductor device; and a second semiconductor device suitable for exchanging data with the first semiconductor device through a first pad, wherein the second semiconductor device includes: a termination circuit coupled to the first pad and suitable for providing a termination resistance according to a first control code and a second control code during a normal operation in which the data are input and output through the first pad; a stress replica circuit suitable for replicating a stress applied to the termination circuit during the normal operation and for generating a detection code during a second calibration mode; a first calibration circuit suitable for adjusting the first control code to match an impedance of a resistor part coupled to a second pad to an external resistor during a first calibration mode; and a second calibration circuit suitable for generating the second control code by adjusting the first control code according to the detection code during the second calibration mode.

According to an embodiment, an operating method of a semiconductor device including at least one first resistor group and at least one second resistor group both coupled to a first pad, includes replicating a stress applied to the second resistor group during a normal operation in which the data are input and output through the first pad; adjusting a first control code to match an impedance of a resistor part coupled to a second pad to an external resistor during a first calibration mode; and generating a detection code according to a replicated stress and generating a second control code by adjusting is the first control code according to the detection code, during a second calibration mode.

According to an embodiment, a semiconductor device includes a first circuitry including a first resistance group and suitable for: generating a first control code for the first resistance group to have a first resistance for impedance matching to an external resistance, and providing an external with the first resistance comprising an on-resistance during a read operation; and a second circuitry including a second resistance group and suitable for: generating, by adjusting the first control code according to a detection code, a second control code for the second resistance group to have a second resistance, and providing the external with the second resistance comprising the on-resistance during the read operation and comprising an on-die termination resistance during a write operation, wherein the second resistance group includes one or more transistors, and wherein the detection code represents replicated deterioration of the transistors caused by an electrical stress applied thereto during the read and write operations.

According to the embodiments, the calibration circuit may generate the termination control code by replicating and reflecting the deterioration of the transistors in the termination circuit, thereby improving impedance matching characteristics while improving signal integrity (SI) characteristics.

DETAILED DESCRIPTION

Various embodiments are described below with reference to the accompanying drawings. The embodiments may, however, be embodied in different forms and thus should not be construed as limited to the embodiments set forth herein. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" is two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Figure 1:
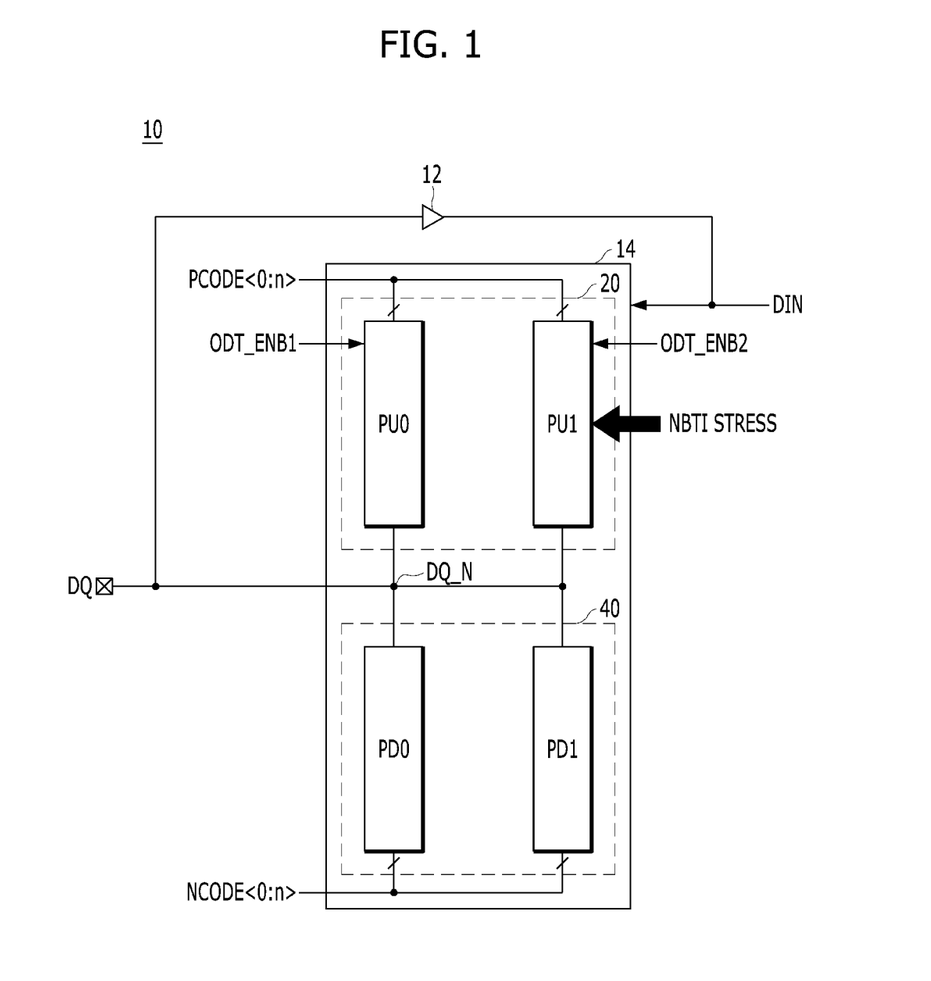
FIG. 1 is a configuration diagram illustrating a semiconductor device including a termination circuit.
Figure 2A:
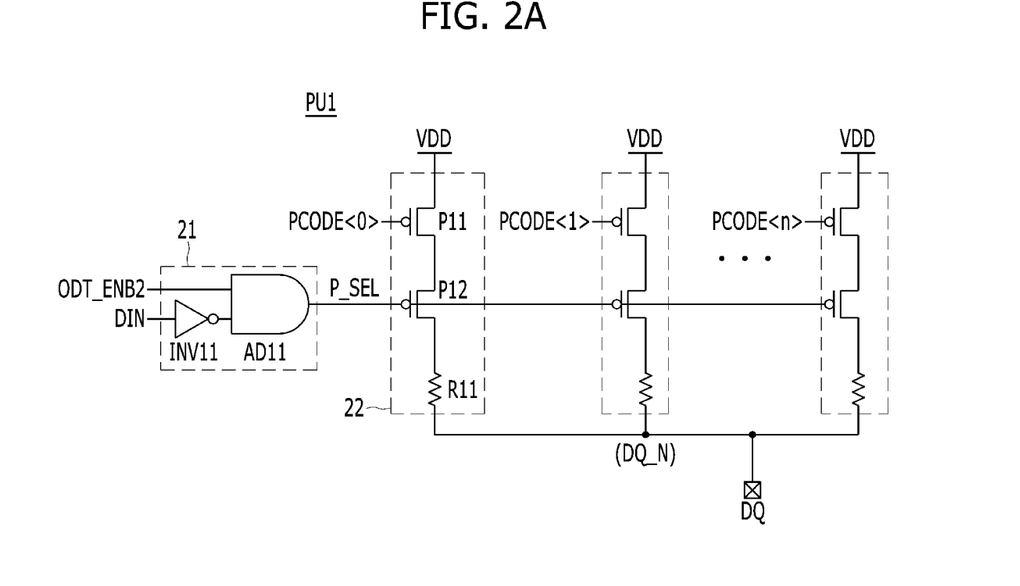
FIGS. 2A and 2B are detailed circuit diagrams illustrating a second pull-up resistor group and a second pull-down resistor group of FIG. 1.
Figure 2B:
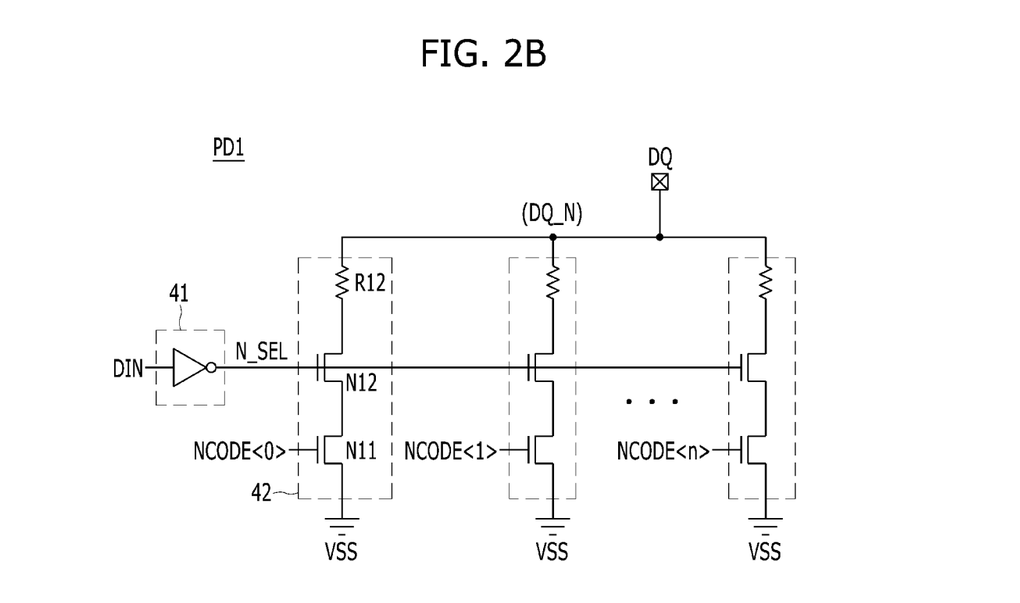
Figure 3:
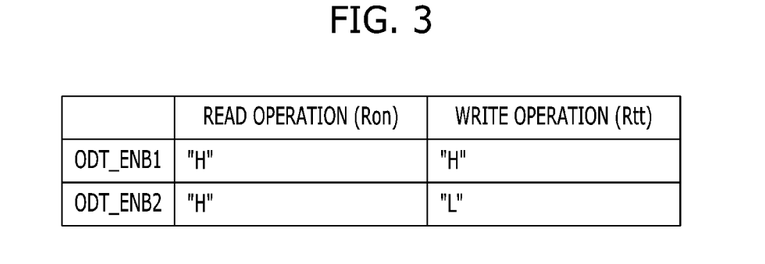
FIG. 3 is a table for describing operations of first and second pull-up resistor groups of FIG. 1.

FIG. 1 is a configuration diagram illustrating a semiconductor device 10 including termination circuits 20 and 40. FIGS. 2A and 2B are detailed circuit diagrams illustrating a second pull-up resistor group PU1 and a second pull-down resistor group PD1 of FIG. 1. FIG. 3 is a table for describing operations of the first and second pull-up resistor groups PU0 and PU1 of FIG. 1.

Referring to FIG. 1, the semiconductor device 10 may include a data pad DQ for receiving/outputting data, an input buffer 12, and an output driver 14.

The input buffer 12 may provide internal data DIN to an internal circuit (not shown) by buffering the data inputted through the data pad DQ during a write operation. Although it is not shown, the input buffer 12 may operate according to a write command.

The output driver 14 may output the data to the data pad DQ by driving the internal data DIN provided from the internal circuit during a read operation. The output driver 14 may include the termination circuits 20 and 40 for providing a pull-up impedance and/or a pull-down impedance to the data pad DQ during the read operation or the write operation. Although FIG. 1 shows one data pad DQ, the present invention is not limited thereto. According to an embodiment, a plurality of data pads and a plurality of termination circuits corresponding to the data pads may be disposed in the semiconductor device 10.

The termination circuits 20 and 40 may include a pull-up termination circuit 20 and a pull-down termination circuit 40, which are coupled to the data pad DQ through an output node DQ_N.

During the read operation or the write operation, an impedance matching between the semiconductor device 10 and an external device (not shown) may be achieved by a termination resistance determined by the pull-up impedance provided from the pull-up termination circuit 20 and the pull-down impedance provided from the pull-down termination circuit 40.

The pull-up termination circuit 20 may include a plurality of pull-up resistor groups (e.g., first and second pull-up resistor groups PU0 and PU1), each comprising a plurality of resistors coupled in parallel. The first and second pull-up resistor groups PU0 and PU1 may be activated according to the internal data DIN and a corresponding one of first and second termination enable signals ODT_ENB1 and ODT_ENB2, and trimmed to have a specific target resistance value (e.g., 240 ohm) depending on a pull-up control code PCODE<0:n>.

The first and second pull-up resistor groups PU0 and PU1 may have substantially the same configuration. For example, referring to FIG. 2A, the second pull-up resistor group PU1 may include a pull-up control logic 21 and a plurality of unit resistors 22.

The pull-up control logic 21 may generate a pull-up selection signal P_SEL according to the internal data DIN and the second termination enable signal ODT_ENB2. The pull-up control logic 21 may include an inverter INV11 and a logic AND gate AD11. The inverter INV11 may invert a logic level of the internal data DIN, and the logic AND gate AD11 may perform a logic AND operation on an output of the inverter INV11 and the second termination enable signal ODT_ENB2. Thus, when the second termination enable signal ODT_ENB2 is disabled to a logic high level, the pull-up control logic 21 may output the pull-up selection signal P_SEL by inverting the logic level of the internal data DIN. When the second termination enable signal ODT_ENB2 is enabled to a logic low level, the pull-up control logic 21 may output the pull-up selection signal P_SEL of a logic low level, regardless of the logic level of the internal data DIN.

The plurality of unit resistors 22 may be coupled in parallel between a source voltage (VDD) terminal and the output node DQ_N, and turned on in response to the pull-up selection signal P_SEL to receive respective bits of the pull-up control code PCODE<0:n>. The unit resistors 22 may correspond to the bit number (n+1) of the pull-up control code PCODE<0:n>. Each of the unit resistors 22 may include a first pull-up transistor P11, a second pull-up transistor P12, and a resistor element R11, which are coupled in series between the source voltage (VDD) terminal and the output node DQ_N. The first pull-up transistor P11 may be implemented with a p-type metal oxide semiconductor (PMOS) transistor, and turned on according to a corresponding bit among the pull-up control code PCODE<0:n>. The second pull-up transistor P12 may be implemented with a PMOS transistor, and turned on according to the pull-up selection signal P_SEL. With the above configuration, the second pull-up resistor group PU1 may be trimmed to have the specific target resistance value (e.g., 240 ohm) according to the pull-up control code PCODE<0:n>, when the second termination enable signal ODT_ENB2 is disabled to a logic high level and the internal data DIN has a logic high level.

Referring back to FIG. 1, the pull-down termination circuit 40 may include a plurality of pull-down resistor groups (e.g., first and second pull-down resistor groups PD0 and PD1), each comprising a plurality of resistors coupled in parallel. The first and second pull-down resistor groups PD0 and PD1 may be activated according to the internal data DIN, and trimmed to have a specific target resistance value (e.g., 240 ohm) depending on a pull-down control code NCODE<0:n>.

The first and second pull-down resistor groups PD0 and PD1 may have substantially the same configuration. For example, referring to FIG. 2B, the second pull-down resistor group PD1 may include a pull-down control logic 41 and a plurality of unit resistors 42.

The pull-down control logic 41 may generate a pull-down selection signal N_SEL according to the internal data DIN. The pull-down control logic 41 may be implemented with an inverter that inverts a logic level of the internal data DIN to output the pull-down selection signal N_SEL.

The plurality of unit resistors 42 may be coupled in parallel between the output node DQ_N and a ground voltage (VSS) terminal, and turned on in response to the pull-down selection signal N_SEL to receive respective bits of the pull-down control code NCODE<0:n>. The unit resistors 42 may correspond to the bit number (n+1) of the pull-down control code NCODE<0:n>. Each of the unit resistors 42 may include a first pull-down transistor N11, a second pull-down transistor N12, and a resistor element R12, which are coupled in series between the ground voltage (VSS) terminal and the output node DQ_N. The first pull-down transistor N11 may be implemented with a n-type metal oxide semiconductor (NMOS) transistor, and is turned on according to a corresponding bit among the pull-down control code NCODE<0:n>. The second pull-down transistor N12 may be implemented with an NMOS transistor, and turned on according to the pull-down selection signal N_SEL. With the above configuration, the second pull-down resistor group PD1 may be trimmed to have the specific target resistance value (e.g., 240 ohm) according to the pull-down control code NCODE<0:n>, when the internal data DIN has a logic low level.

Meanwhile, the termination circuits 20 and 40 may provide the termination resistance determined by the pull-up impedance and/or the pull-down impedance to the data pad DQ. At this time, the termination circuits 20 and 40 may provide the termination resistance at different values depending on the write operation or the read operation. For example, as shown in FIG. 3, during the read operation, the first and second termination enable signals ODT_ENB1 and ODT_ENB2 may be disabled to a logic high level. The termination circuits 20 and 40 may provide the termination resistance as an on-resistance Ron to the output driver 14, the termination resistance being determined by the pull-up impedance provided from the first and second pull-up resistor groups PU0 and PU1 and the pull-down impedance provided from the first and second pull-down resistor groups PD0 and PD1, according to the logic level of the internal data DIN. Further, as shown in FIG. 3, during the write operation, the first termination enable signal ODT_ENB1 may be disabled to a logic high is level but the second termination enable signal ODT_ENB2 may be enabled to a logic low level. The termination circuits 20 and 40 may provide the termination resistance as an on-die termination resistance Rtt to the data pad DQ, the termination resistance being determined by the pull-up impedance provided from the second pull-up resistor group PU1.

When a high electric field is applied to the gate of the PMOS transistor, over time, the negative bias used in the semiconductor device becomes unstable according to a change in temperature. This is called a negative bias temperature instability (NBTI) stress. When the NBTI stress occurs, the threshold voltage Vth of the PMOS transistor increases, and performance of the semiconductor memory device may deteriorate. Since the PMOS transistors (in particular, the second pull-up transistor P12) included in the second pull-up resistor group PU1 maintain a turned-on state during the read operation or the write operation, the second pull-up transistor P12 may be deteriorated due to the NBTI stress. Further, the termination circuits 20 and 40 may provide the on-die termination resistance Rtt for a relatively longer time than for the turned-on state, thereby further accelerating the deterioration of the PMOS transistors in the second pull-up resistor group PU1. As a result, the threshold voltage Vth of the PMOS transistors in the second pull-up resistor group PU1 may be much greater than that of the PMOS transistors in the first pull-up resistor group PU0, and thus, the on-resistance Ron during the read operation may be increased, resulting in deterioration of the signal integrity (SI). Thus, it becomes difficult for the second pull-up resistor group PU1 to provide an accurate pull-up impedance.

Hereinafter, a method of providing an accurate impedance by replicating the characteristics of PMOS transistors degraded due to NBTI stress and reflect the replicated characteristics to generate the pull-up control code in accordance with an embodiment of the present invention will be described.

Figure 4:
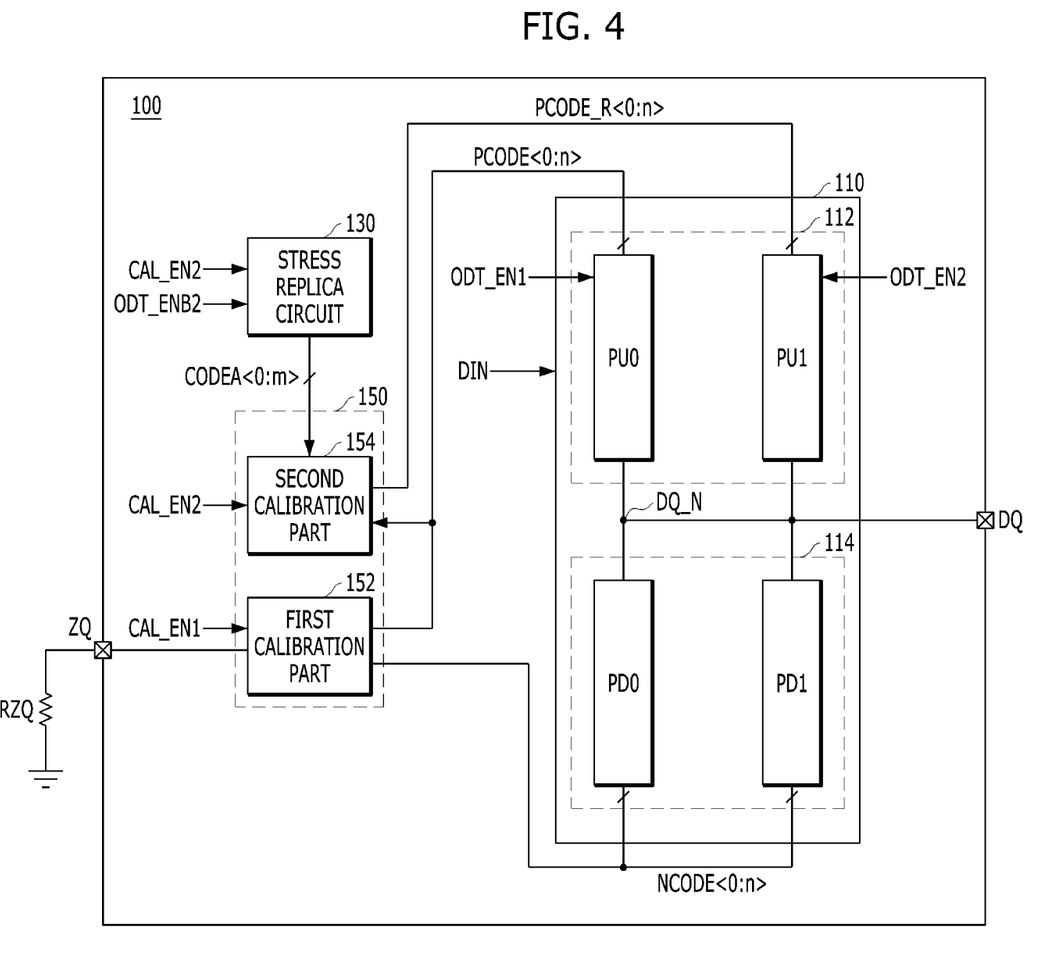
FIG. 4 is a configuration diagram illustrating a semiconductor device in accordance with an embodiment of the present invention.
Figure 5A:
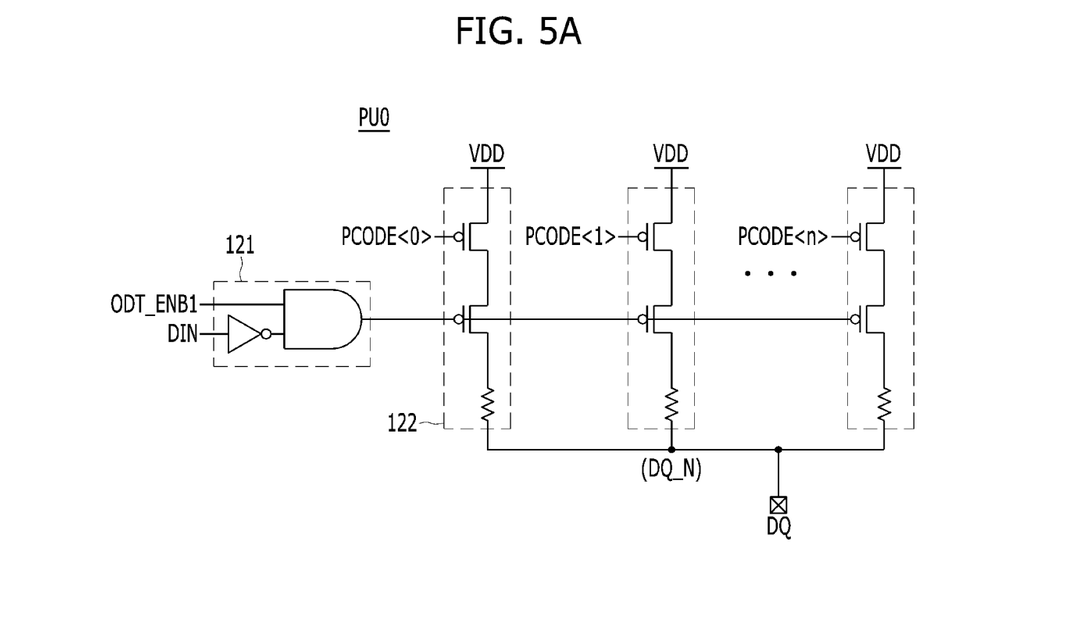
FIGS. 5A and 5B are detailed circuit diagrams illustrating first and second pull-up resistor groups of FIG. 4.
Figure 5B:
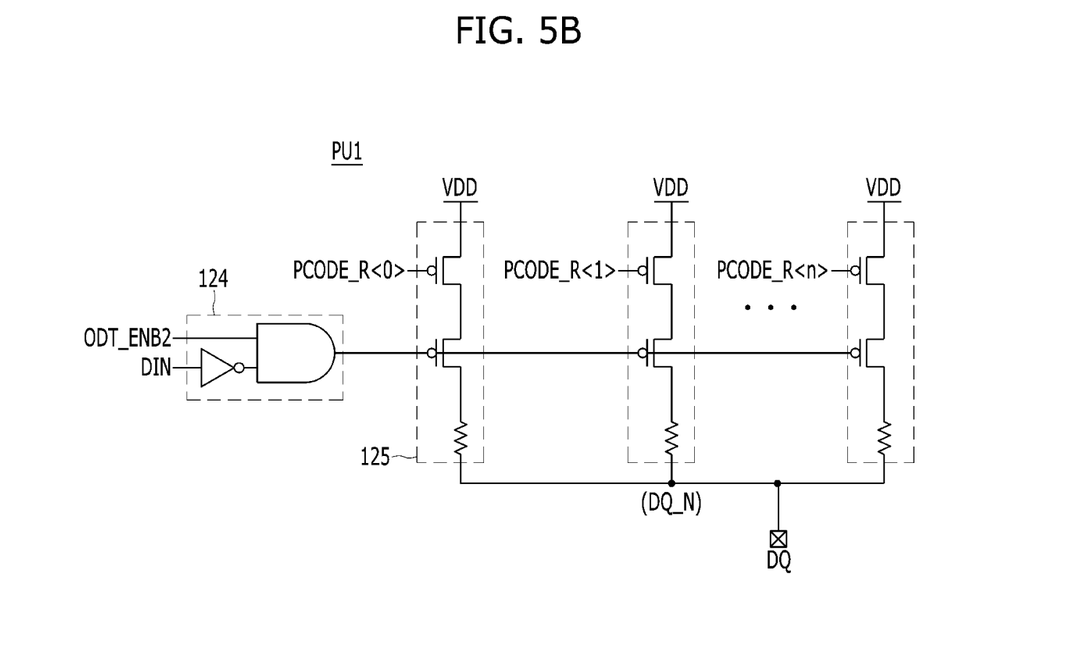

FIG. 4 is a configuration diagram illustrating a semiconductor device 100 in accordance with an embodiment of the present invention. FIGS. 5A and 5B are detailed circuit diagrams illustrating first and second pull-up resistor groups PU0 and PU1 of FIG. 4.

Referring to FIG. 4, the semiconductor device 100 may include a first pad DQ, a second pad ZQ, a termination circuit 110, a stress replica circuit 130, and a calibration circuit 150. The first pad DQ is a data input/output pad for receiving/outputting data, and the second pad ZQ may include a calibration pad coupled to an external resistor RZQ. Hereinafter, a read operation or write operation in which data are input and output through the first pad DQ may be defined as a normal operation, and an operation for generating and adjusting a termination control code, which varies depending on process, voltage, and temperature (PVT) condition, through the second pad ZQ, may be defined as a calibration operation. In this embodiment, the termination control code may include a first pull-up control code PCODE<0:n>, a second pull-up control code PCODE_R<0:n>, and a pull-down control code NCODE<0:n>.

The termination circuit 110 may be coupled to the first pad DQ, and provide a termination resistance according to the first pull-up control code PCODE<0:n>, the second pull-up control code PCODE_R<0:n> and the pull-down control code NCODE<0:n> during the normal operation in which the data are input and output through the first pad DQ. The termination circuit 110 may include a pull-up termination circuit 112 and a pull-down termination circuit 114, which are coupled to the first pad DQ through an output node DQ_N. During the read operation or the write operation, an impedance matching between the semiconductor device 100 and an external device (not shown) may be achieved by the termination resistance determined by a pull-up impedance provided from the pull-up termination circuit 112 and a pull-down impedance provided from the pull-down termination circuit 114.

The pull-up termination circuit 112 may include a plurality of pull-up resistor groups (e.g., first and second pull-up resistor groups PU0 and PU1), each comprising a plurality of resistors coupled in parallel. The first pull-up resistor group PU0 may be coupled to the first pad DQ, and activated according to a first termination enable signal ODT_ENB1 and internal data DIN to provide a first pull-up impedance adjusted depending on the first pull-up control code PCODE<0:n>. The second pull-up resistor group PU1 may be coupled is to the first pad DQ, and activated according to a second termination enable signal ODT_ENB2 and the internal data DIN to provide a second pull-up impedance adjusted depending on the second pull-up control code PCODE_R<0:n>.

The pull-down termination circuit 114 may include a plurality of pull-down resistor groups (e.g., first and second pull-down resistor groups PD0 and PD1), each comprising a plurality of resistors coupled in parallel. The first pull-down resistor group PD0 may be coupled to the first pad DQ, and activated according to the internal data DIN to provide a first pull-down impedance adjusted depending on the pull-down control code NCODE<0:n>. The second pull-down resistor group PD1 may be coupled to the first pad DQ, and activated according to the internal data DIN to provide a second pull-down impedance adjusted depending on the pull-down control code NCODE<0:n>.

During the read operation, the first and second termination enable signals ODT_ENB1 and ODT_ENB2 may be disabled to a logic high level, so that the first and second pull-up/pull-down impedance may form an on-resistance Ron to an output driver. During the write operation, the second termination enable signal ODT_ENB2 may be enabled to a logic low level, so that the second pull-up impedance may form an on-die termination resistance Rtt to the first pad DQ.

The first and second pull-up resistor groups PU0 and PU1 may have substantially the same configuration as the second pull-up resistor group PU1 of FIG. 2A, and the first and second pull-down resistor groups PD0 and PD1 may have substantially the same configuration as the second pull-down resistor group PD1 of FIG. 2B. However, unlike the first and second pull-up resistor groups PU0 and PU1 of FIG. 1, the first and second pull-up resistor groups PU0 and PU1 in accordance with the embodiment may respectively receive different pull-up control codes from each other.

In detail, referring to FIG. 5A, the first pull-up resistor group PU0 may include a pull-up control logic 121 and a plurality of unit resistors 122. Since the pull-up control logic 121 and the unit resistors 122 may have substantially the same configuration as the pull-up control logic 21 and the unit resistors 22 of FIG. 2A, except that the pull-up control logic 121 receives the first termination enable signal ODT_ENB1, not the second termination enable signal ODT_ENB2, the detailed explanation will be omitted. The first pull-up resistor group PU0 may be trimmed to have a specific target resistance value (e.g., 240 ohm) according to the first pull-up control code PCODE<0:n>, when the first termination enable signal ODT_ENB1 is disabled to a logic high level and the internal data DIN has a logic high level. As shown in FIG. 3, since the first termination enable signal ODT_ENB1 is disabled to a logic high level during the read operation or the write operation, the first pull-up resistor group PU0 may provide the target resistance value according to the first pull-up control code PCODE<0:n> and the internal data DIN.

Referring to FIG. 5B, the second pull-up resistor group PU1 may include a pull-up control logic 124 and a plurality of unit resistors 125. Likewise, since the pull-up control logic 124 and the unit resistors 125 may have substantially the same configuration as the pull-up control logic 21 and the unit resistors 22 of FIG. 2A, the detailed explanation will be omitted. The second pull-up resistor group PU1 may be trimmed to have a specific target resistance value (e.g., 240 ohm) according to the second pull-up control code PCODE_R<0:n>, when the second termination enable signal ODT_ENB2 is disabled to a logic high level and the internal data DIN has a logic high level. As shown in FIG. 3, since the second termination enable signal ODT_ENB2 is disabled to a logic high level during the read operation, the second pull-up resistor group PU1 may provide the target resistance value according to the second pull-up control code PCODE_R<0:n> and the internal data DIN. On the contrary, since the second termination enable signal ODT_ENB2 is enabled to a logic low level during the write operation, the second pull-up resistor group PU1 may provide the target resistance value according to the second pull-up control code PCODE_R<0:n> regardless of a logic level of the internal data DIN. At this time, since PMOS transistors included in the second pull-up resistor group PU1 maintain a turned-on state during the read operation or the write operation, the PMOS transistors may be deteriorated due to the NBTI stress, thereby increasing the on-resistance Ron. In accordance with is the embodiment, it is possible to compensate for the on-resistance Ron by applying the second pull-up control code PCODE_R<0:n>, different from the first pull-up control code PCODE <0:n>, to the second pull-up resistor group PU1 in which the deteriorated PMOS transistors are disposed.

Meanwhile, although FIG. 4 shows that each of the pull-up termination circuit 112 and the pull-down termination circuit 114 has two resistor groups, the present invention is not limited thereto. At least two resistor groups may be disposed in each of the pull-up termination circuit 112 and the pull-down termination circuit 114. At this time, the pull-up termination circuit 112 and the pull-down termination circuit 114 may provide the pull-up impedance and the pull-down impedance sequentially decreased, for example, to 240, 120, 80, 60, 48, 40Ω as the respective termination enable signals are enabled.

The stress replica circuit 130 may replicate a stress, which is applied to the termination circuit 110 during the normal operation, and generate a detection code CODEA<0:m> during a second calibration mode, which will be described later. The stress replica circuit 130 may include a pull-up replica transistor (RP11 of FIG. 6) and a pull-down replica transistor (RN11 of FIG. 6) coupled in series between a source voltage (VDD) terminal and a ground voltage (VSS) terminal. The stress replica circuit 130 may apply a stress (i.e., apply a gate voltage representing a high electric field to replicate the NBTI stress effect) to the pull-up replica transistor RP11 according to the second termination enable signal ODT_ENB2, during the normal operation. For example, as the second termination enable signal ODT_ENB2 is enabled to a logic low level during the write operation, the stress replica circuit 130 may apply the stress to the pull-up replica transistor RP11 by turning on the pull-up replica transistor RP11. Further, the stress replica circuit 130 may generate the detection code CODEA<0:m> representing a replica impedance formed by turning on the pull-up replica transistor RP11 and the pull-down replica transistor RN11 according to a second mode signal CAL_EN2 that is enabled during the second calibration mode. That is, the stress replica circuit 130 (by applying a gate voltage representing a high electric field to pull-up replica transistor RP11) may replicate the characteristics of the PMOS transistors deteriorated due to the NBTI stress during the normal operation by applying the NBTI stress to the pull-up replica transistor RP11, the NBTI stress being substantially the same as that applied to the pull-up termination circuit 112. Further, the stress replica circuit 130 may provide the detection code CODEA<0:m> based on the replicated characteristics, during a calibration operation.

For reference, in the embodiment of the present invention, the calibration operation may be classified into a first calibration mode for setting the first pull-up control code PCODE<0:n>, and the second calibration mode for setting the second pull-up control code PCODE_R<0:n>. Since the first calibration mode is distinct from the second calibration mode, a first mode signal CAL_EN1 may be enabled for the first calibration mode of the calibration operation, while the second mode signal CAL_EN2 may be enabled for the second calibration mode of the calibration operation. That is, an activation section of the first mode signal CAL_EN1 may not overlap an activation section of the second mode signal CAL_EN2. Depending on an embodiment, the calibration operation may be classified into two more calibration modes. Hereinafter, a case where the first mode signal CAL_EN1 and the second mode signal CAL_EN2 are sequentially enabled to a logic high level during the calibration operation will be explained as an example.

Figure 7:
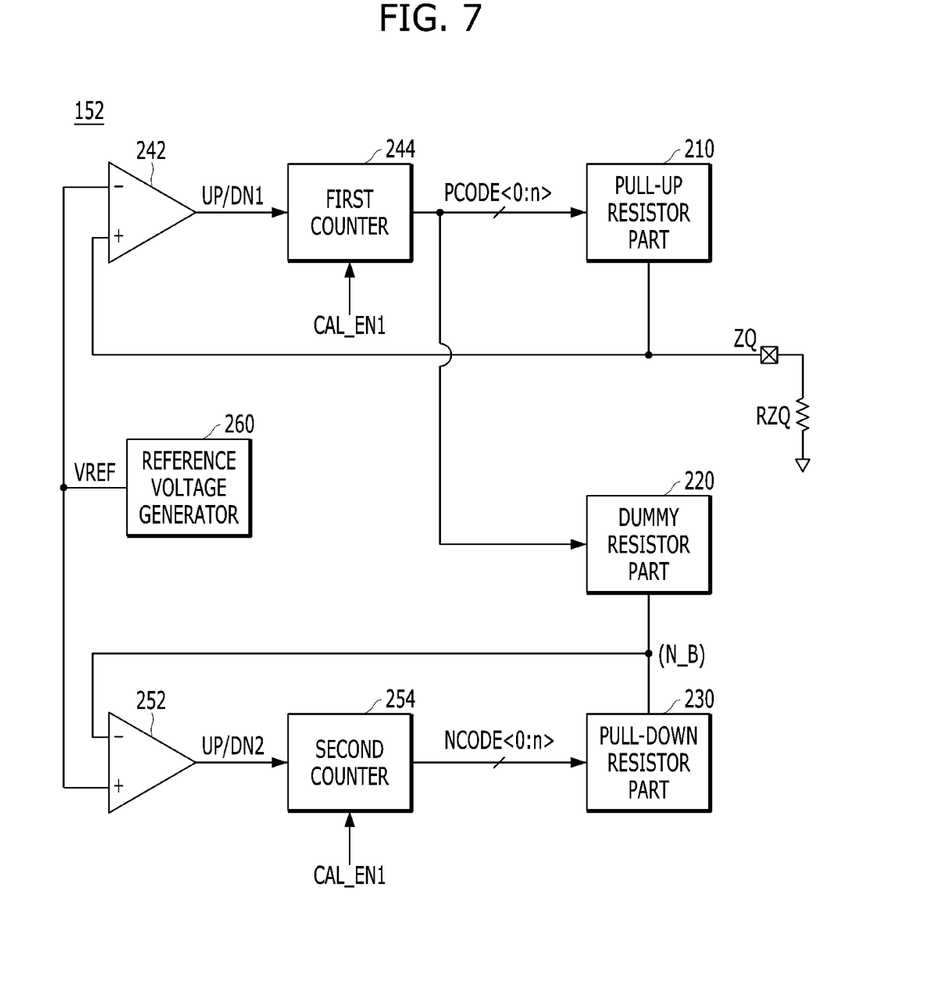
FIG. 7 is a circuit diagram illustrating a first calibration circuit of FIG. 4.

The calibration circuit 150 may include at least one of a pull-up resistor part (210 of FIG. 7) and a pull-down resistor part (230 of FIG. 7). The calibration circuit 150 may adjust the first pull-up control code PCODE<0:n> and the pull-down control code NCODE<0:n> to match an impedance of the resistor part coupled to the second pad ZQ to the external resistor RZQ coupled to the second pad ZQ, during the first calibration mode. Further, the calibration circuit 150 may generate the second pull-up control code PCODE_R<0:n> by adjusting the first pull-up control code PCODE<0:n> according to the detection code CODEA<0:m>, during the second calibration mode. In detail, the calibration circuit 150 may include a first calibration circuit 152 and a second calibration circuit 154.

The first calibration circuit 152 may be activated according to the first mode signal CAL_EN1. During the first calibration mode, the first calibration circuit 152 may adjust the first pull-up control code PCODE<0:n> to match an impedance of the pull-up resistor part 210 coupled to the second pad ZQ to the external resistor RZQ, and adjust the pull-down control code NCODE<0:n> to match an impedance of the pull-down resistor part 230 to the external resistor RZQ.

The second calibration circuit 154 may be activated according to the second mode signal CAL_EN2. During the second calibration mode, the second calibration circuit 154 may generate the second pull-up control code PCODE_R<0:n> by adjusting the first pull-up control code PCODE<0:n> generated by the first calibration circuit 152, according to the detection code CODEA<0:m>. The first pull-up control code PCODE<0:n> generated by the first calibration circuit 152 may be a code that has been adjusted in the first calibration mode.

As described above, the semiconductor device 100 in accordance with the embodiment may generate the second pull-up control code PCODE_R<0:n> by replicating and reflecting the characteristics of PMOS transistors in the second pull-up resistor group PU1, which are deteriorated due to the always-turn-on state during the read operation or the write operation. Further, the semiconductor device 100 may apply the first pull-up control code PCODE<0:n> to the first pull-up resistor group PU0 while applying the second pull-up control code PCODE_R<0:n> different from the first pull-up control code PCODE<0:n> to the second pull-up resistor group PU1 including the deteriorated PMOS transistors, thereby compensating for the on-resistance Ron. Thus, it is possible to improve impedance matching characteristics while improving signal integrity (SI) characteristics.

Figure 6:
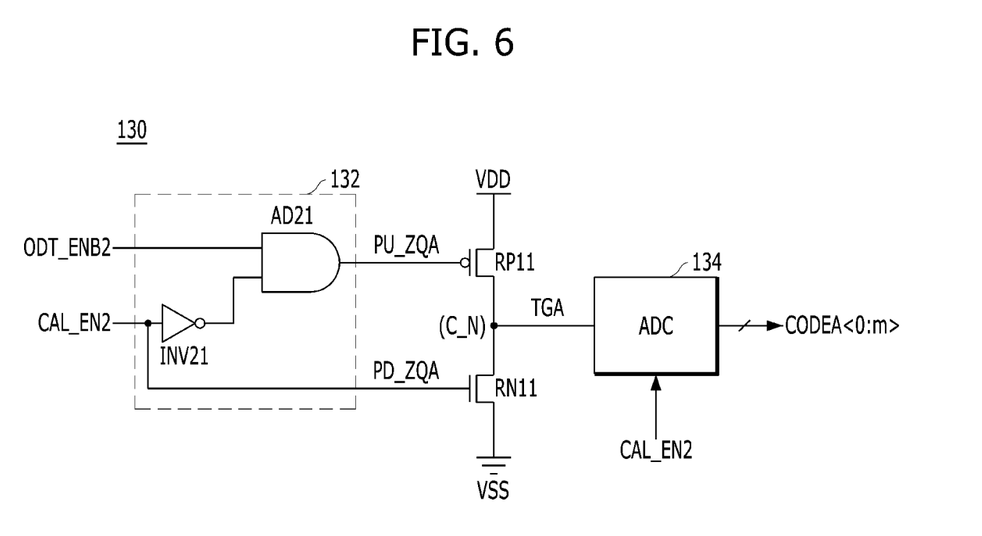
FIG. 6 is a circuit diagram illustrating a stress replica circuit of FIG. 4.

FIG. 6 is a circuit diagram illustrating the stress replica circuit 130 of FIG. 4.

Referring to FIG. 6, the stress replica circuit 130 may include the pull-up replica transistor RP11, the pull-down replica transistor RN11, a replica control circuit 132, and an analog-digital converter (ADC) 134.

The pull-up replica transistor RP11 and the pull-down replica transistor RN11 may be coupled in series between a source voltage (VDD) terminal and a ground voltage (VSS) terminal, and respectively receive a first replica control signal PU_ZQA and a second replica control signal PD_ZQA through their gates. The pull-up replica transistor RP11 may be implemented with a PMOS transistor. The first replica control signal PU_ZQA may be enabled to a logic low level for activating the PMOS transistor. The pull-down replica transistor RN11 may be implemented with an NMOS transistor. The second replica control signal PD_ZQA may be enabled to a logic high level for activating the NMOS transistor.

The replica control circuit 132 may enable the first replica is control signal PU_ZQA during the normal operation, and enable both the first replica control signal PU_ZQA and the second replica control signal PD_ZQA during the second calibration mode. For example, the replica control circuit 132 may include an inverter INV21 and a logic AND gate AD21. The inverter INV21 may invert the second mode signal CAL_EN2, and the logic AND gate AD21 may perform a logic AND operation on an output of the inverter INV21 and the second termination enable signal ODT_ENB2, to thereby output first replica control signal PU_ZQA. The replica control circuit 132 may output the second mode signal CAL_EN2 as the second replica control signal PD_ZQA. Depending on an embodiment, the replica control circuit 132 may buffer the second mode signal CAL_EN2 to output second replica control signal PD_ZQA. Thus, the replica control circuit 132 may enable only the first replica control signal PU_ZQA when the second termination enable signal ODT_ENB2 is enabled to a logic low level. The replica control circuit 132 may enable both the first replica control signal PU_ZQA and the second replica control signal PD_ZQA when the second mode signal CAL_EN2 is enabled to a logic high level.

The ADC 134 may be activated according to the second mode signal CAL_EN2, and convert a signal TGA at a common node C_N between the pull-up replica transistor RP11 and the pull-down replica transistor RN11 to output the detection code CODEA<0:m>. That is, the ADC 134 may convert the signal TGA of analog type into the detection code CODEA<0:m> of digital type.

As described above, the stress replica circuit 130 may replicate the characteristics of the pull-up replica transistor RP11 by applying the stress to the pull-up replica transistor RP11, during the normal operation. At this time, in order to replicate the characteristics of the PMOS transistors deteriorated in the second pull-up resistor group PU1, the stress replica circuit 130 may apply the stress to the pull-up replica transistor RP11 according to the second termination enable signal ODT_ENB2. As the degree of deterioration increases, the on-resistance Ron increases, which lowers a voltage level of the signal TGA on the common node C_N. Accordingly, a value of the detection code CODEA<0:m> may be determined, and finally output.

FIG. 7 is a circuit diagram illustrating the first calibration circuit 152 of FIG. 4.

Referring to FIG. 7, the first calibration circuit 152 may include a pull-up resistor part 210, a dummy resistor part 220, a pull-down resistor part 230, a first comparator 242, a second comparator 252, a first counter 244, a second counter 254, and a reference voltage generator 260. The first counter 244 and the second counter 254 may be enabled according to the first mode signal CAL_EN1.

The first comparator 242 may compare a voltage of the second pad ZQ with a reference voltage VREF that is generated from the reference voltage generator 260, to generate a first up/down signal UP/DN1 according to a comparison result. The voltage of the second pad ZQ may be determined by a voltage division ratio of the external resistor RZQ and the pull-up resistor part 210. The first counter 244 may increase or decrease a value of the first pull-up control code PCODE<0:n> in response to the first up/down signal UP/DN1. The pull-up resistor part 210 may include a plurality of pull-up resistors coupled in parallel, the pull-up resistors being on or off according to the first pull-up control code PCODE<0:n>.

The pull-up resistor part 210 may be coupled to the second pad ZQ, and adjust its impedance by turning on or off the pull-up resistors according to the first pull-up control code PCODE<0:n>. The adjusted impedance of the pull-up resistor part 210 may again affect the voltage of the second pad ZQ and the above operation may be repeated. As a result, until the impedance of the pull-up resistor part 210 coupled to the second pad ZQ is matched to the external resistor RZQ, the calibration operation may be repeated. Such a calibration operation may be defined as a pull-up calibration operation.

The pull-up resistor part 210 may be designed to be similar to the pull-up termination circuit (112 of FIG. 4) that drives the first pad DQ, which tends to be the same or similar. The dummy resistor part 220 may have substantially the same configuration as the pull-up resistor part 210. The pull-down resistor part 230 may include a plurality of pull-down resistors coupled in parallel, the pull-down resistors being on or off according to the pull-down control code NCODE<0:n>. The pull-down resistor part 230 may be designed to be similar to the pull-down termination circuit, which tends to be the is same or similar.

The pull-up control code PCODE<0:n> generated by the pull-up calibration operation may be provided to the dummy resistor part 220 to determine an impedance of the dummy resistor part 220. The second comparator 252 may compare a voltage at a common node NB of the dummy resistor part 220 and the pull-down resistor part 230, with the reference voltage VREF to generate a second up/down signal UP/DN2 according to a comparison result. The second counter 254 may increase or decrease a value of the pull-down control code NCODE<0:n> in response to the second up/down signal UP/DN2. The pull-down resistor part 230 may include a plurality of pull-down resistors coupled in parallel, the pull-down resistors being on or off according to the pull-down control code NCODE<0:n>. Similar to the pull-up calibration operation, until the voltage at the common node NB is identical to the reference voltage VREF, the calibration operation may be repeated. Such a calibration operation may be defined as a pull-down calibration operation. Thus, the pull-up control code PCODE<0:n> and the pull-down control code NCODE<0:n> may be generated as a result of a ZQ calibration operation including the pull-up calibration operation and the pull-down calibration operation, and provided to the termination circuit (110 of FIG. 4) to control its impedance.

Figure 8:
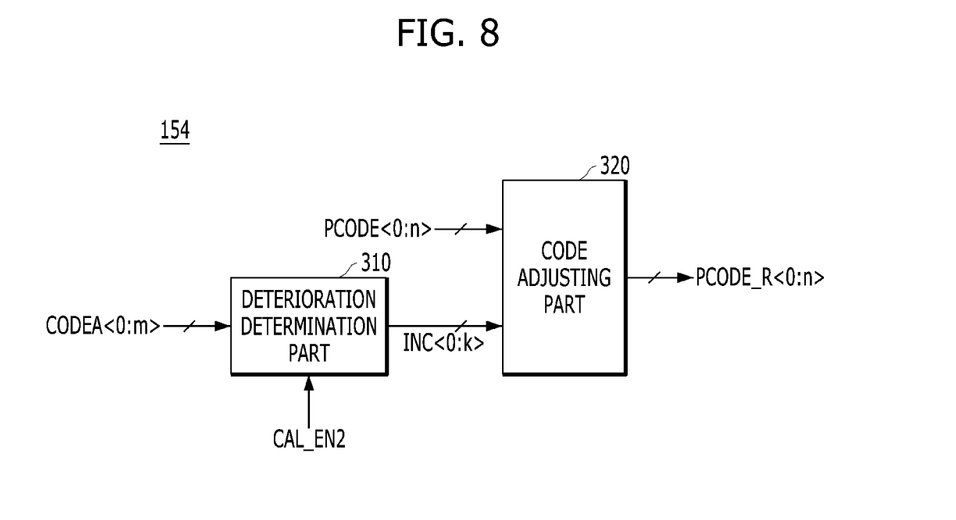
FIG. 8 is a circuit diagram illustrating a second calibration circuit of FIG. 4.

FIG. 8 is a circuit diagram illustrating the second calibration circuit 154 of FIG. 4.

Referring to FIG. 8, the second calibration circuit 154 may include a deterioration determination part 310 and a code adjusting part 320.

The deterioration determination part 310 may be enabled according to the second mode signal CAL_EN2. The deterioration determination part 310 may generate an adjusting code INC<0:k> representing the degree of deterioration of the PMOS transistors, which configure the second pull-up resistor group PU1 and of which the deterioration characteristic is replicated by the pull-up replica transistor RP11, according to the detection code CODEA<0:m>, during the second calibration mode. For example, the deterioration determination part 310 may calculate a difference between the detection code CODEA<0:m> and a reference code that may occur if the PMOS transistors configuring the second pull-up resistor group PU1 are in an ideal condition without deterioration, and generate the adjusting code INC<0:k> corresponding to the calculated difference. Depending on an embodiment, the deterioration determination part 310 may be implemented with a subtractor. For example, when the reference code is composed of "1111" and the detection code CODEA<0:m> of "1001" may be inputted, the deterioration determination part 310 may generate the adjusting code INC<0:k> of "110" by subtracting "1001" from "1111".

The code adjusting part 320 may reflect the adjusting code INC<0:k> onto the first pull-up control code PCODE<0:n> to is generate the second pull-up control code PCODE_R<0:n>. Depending on an embodiment, the code adjusting part 320 may be implemented with an adder.

With the above configuration, the second calibration circuit 154 may generate the second pull-up control code PCODE_R<0:n> by adjusting the first pull-up control code PCODE<0:n> generated from the first calibration circuit 152, according to the detection code CODEA<0:m>, during the second calibration mode. The second pull-up control code PCODE_R<0:n> may be generated to more increase the drivability of the PMOS transistors compared to the first pull-up control code PCODE<0:n>, to thereby compensate for the on-resistance Ron of the deteriorated PMOS transistors in the second pull-up resistor group PU1.

Hereinafter, referring to FIGS. 4 to 9, an operation of a semiconductor device in accordance with an embodiment of the present invention will be explained.

Figure 9:
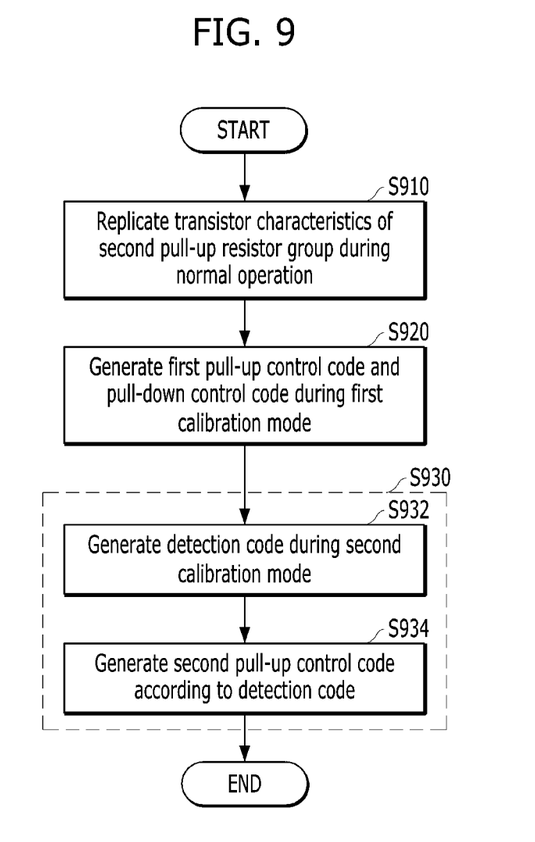
FIG. 9 is a flow chart for describing an operation of a semiconductor device in accordance with an embodiment of the present invention.

FIG. 9 is a flow chart for describing an operation of a semiconductor device in accordance with an embodiment of the present invention.

Figure 10:
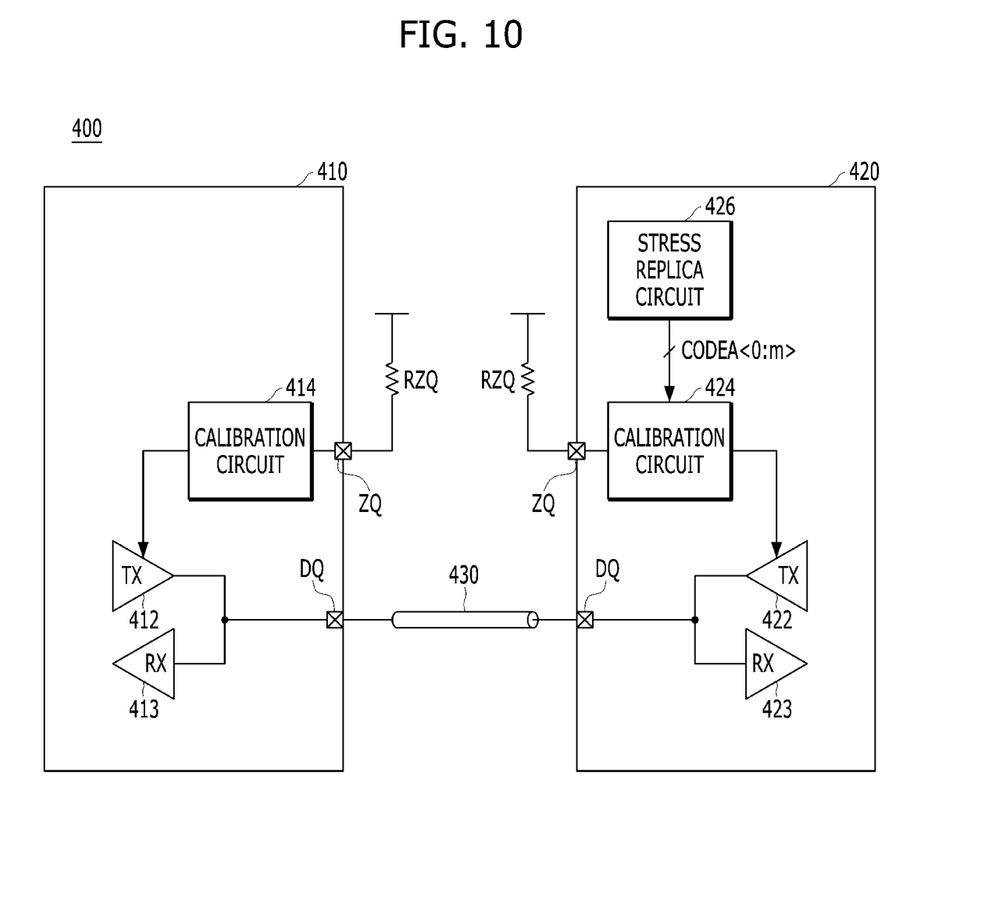
FIG. 10 is a configuration diagram illustrating a semiconductor system in accordance with an embodiment of the present invention.

Referring to FIG. 10, the semiconductor device 100 may perform a read operation or a write operation in which data are input and output through the first pad DQ. At this time, the first pull-up resistor group PU0 coupled to the first pad DQ is activated according to the first termination enable signal ODT_ENB1 and the internal data DIN to provide the first pull-up impedance adjusted depending on the first pull-up control code PCODE<0:n>. The second pull-up resistor group PU1 coupled to the first pad DQ is activated according to the second termination enable signal ODT_ENB2 and the internal data DIN to provide the second pull-up impedance adjusted depending on the second pull-up control code PCODE_R<0:n>.

During the read operation, the first and second termination enable signals ODT_ENB1 and ODT_ENB2 are disabled to a logic high level. The termination circuit 110 provides the termination resistance as an on-resistance Ron of the first pad DQ, the termination resistance being determined by the pull-up impedance provided from the first and second pull-up resistor groups PU0 and PU1, and the pull-down impedance provided from the first and second pull-down resistor groups PD0 and PD1. On the contrary, during the write operation, the first termination enable signal ODT_ENB1 maintains a logic high level but the second termination enable signal ODT_ENB2 is enabled to a logic low level. The termination circuit 110 provides the termination resistance as an on-die termination resistance Rtt to the first pad DQ, the termination resistance being determined by the pull-up impedance provided from the second pull-up resistor group PU1.

In accordance with the embodiment, the stress replica circuit 130 replicates a stress applied to the termination circuit 110 during the normal operation such as the read operation and the write operation, and generates the detection code CODEA<0:m> during the calibration operation (at S910). The stress replica circuit 130 may replicate the characteristics of the PMOS transistors deteriorated due to the NBTI stress, onto the pull-up replica transistor RP11, by applying the stress to the pull-up replica transistor RP11 according to the second termination enable signal ODT_ENB2 during the write operation.

Thereafter, the semiconductor device 100 enters the first calibration mode of the calibration operation. The first calibration circuit 152 may adjust the first pull-up control code PCODE<0:n> to match the impedance of the pull-up resistor part 210 to the external resistor RZQ coupled to the second pad ZQ, and adjust the pull-down control code NCODE<0:n> to match the impedance of the pull-down resistor part 230 to the external resistor RZQ (at S920).

Thereafter, the semiconductor device 100 enters the second calibration mode of the calibration operation (at S930). The stress replica circuit 130 may generate the detection code CODEA<0:m> representing a replica impedance formed by turning on the pull-up replica transistor RP11 and the pull-down replica transistor RN11 (at S932). The second calibration circuit 154 may the second pull-up control code PCODE_R<0:n> by adjusting the first pull-up control code PCODE<0:n> according to the detection code CODEA<0:m> (at S934).

FIG. 10 is a configuration diagram illustrating a semiconductor system 400 in accordance with an embodiment of the present is invention.

Referring to FIG. 10, the semiconductor system 400 may include a first semiconductor device 410 and a second semiconductor device 420. The first semiconductor device 410 and the second semiconductor device 420 may be electronic components that communicate with each other. The first semiconductor device 410 may be a master device, and the second semiconductor device 420 may be a slave device that is controlled by the first semiconductor device 410. For example, the first semiconductor device 410 may be a host device such as a processor or a controller, and may include for example one or more of a central processing unit (CPU), a graphic processing unit (GPU), a multimedia processor (MMP), a digital signal processor (DSP), and a memory controller. Furthermore, the first semiconductor device 410 may be realized in the form of a system-on-chip by integrating various processor chips having various functions, such as application processors (AP), into a single chip. The second semiconductor device 420 may be a memory device, and the memory device may include a volatile memory and a nonvolatile memory. The volatile memory may include for example a static RAM (SRAM), a dynamic RAM (DRAM) or a synchronous DRAM (SDRAM), and the nonvolatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM) or a ferroelectric RAM (FRAM).

The first and second semiconductor devices 410 and 420 may be coupled to each other through a signal transmission line 430. The first semiconductor device 410 may include a data pad, and the data pad DQ may be coupled to the signal transmission line 430. The second semiconductor device 420 may include a data pad DQ, and the data pad DQ may be coupled to the signal transmission line 130. The signal transmission line 430 may be a channel, a link or a bus. Although the signal transmission line 430 is illustrated as a transmission line that transmits data, it is to be noted that the embodiment is not limited thereto, and the signal transmission line 430 may transmit a clock signal, a command signal or an address signal. The first semiconductor device 410 may include a transmitting device (TX) 412 and a receiving device (RX) 413. The transmitting device (TX) 412 may generate an output signal and transmit the output signal to the second semiconductor device 420 through the signal transmission line 430. The receiving device (RX) 413 may receive a signal transmitted from the second semiconductor device 420 through the signal transmission line 430. Similarly, the second semiconductor device 420 may include a transmitting device (TX) 422 and a receiving device (RX) 423. The transmitting device (TX) 422 may generate an output signal and transmit the output signal to the first semiconductor device 410 through the signal transmission line 430. The receiving device (RX) 423 may receive a signal transmitted is from the first semiconductor device 410 through the signal transmission line 430.

The transmitting device (TX) 412 of the first semiconductor device 410 may correspond to the termination circuits 20 and 40 of FIG. 1. The first semiconductor device 410 may further include a calibration circuit 414. The calibration circuit 414 may be coupled to an external resistor RZQ through a calibration pad ZQ. The calibration circuit 414 may generate a termination control code by performing a calibration operation, and provide the termination control code to the termination circuit of the transmitting device (TX) 412, thereby setting a resistance value of the transmitting device (TX) 412. For example, the resistance value of the transmitting device (TX) 412 is set to 60 ohm, 120 ohm, or 240 ohm depending on the results of the calibration operation.

The transmitting device (TX) 422 of the second semiconductor device 420 may include the termination circuit 110 of FIG. 4 in accordance with the embodiment. The second semiconductor device 420 may further include a calibration circuit 424 and a stress replica circuit 426. The stress replica circuit 426 may replicate a stress applied to the termination circuit during a normal operation, and generate a detection code CODEA<0:m> during a second calibration mode. The calibration circuit 424 may adjust a first pull-up control code PCODE<0:n> to match an impedance of a pull-up resistor part to the external resistor RZQ, during a first calibration mode of the is calibration operation. The calibration circuit 424 may adjust a pull-down control code NCODE<0:n> to match an impedance of a pull-down resistor part to the external resistor RZQ, during the first calibration mode of the calibration operation. Further, the calibration circuit 424 may generate a second pull-up control code PCODE_R<0:n> by adjusting the first pull-up control code PCODE<0:n> according to the detection code CODEA<0:m>, during a second calibration mode of the calibration operation. The termination control code including the first pull-up control code PCODE<0:n>, the second pull-up control code PCODE_R<0:n> and the pull-down control code NCODE<0:n> may be provided to the termination circuit of the transmitting device (TX) 422, thereby setting a resistance value of the transmitting device (TX) 422. For example, the resistance value of the transmitting device (TX) 422 is set to 60 ohm, 120 ohm, or 240 ohm depending on the results of the calibration operation.

Meanwhile, although FIG. 10 shows that only the second semiconductor device 420 includes the stress replica circuit 426, the present invention is not limited thereto. Depending on an embodiment, the stress replica circuit 426 may be included in both the first semiconductor device 410 and the second semiconductor device 420.

As described above, in accordance with the embodiment of the present invention, the semiconductor device may generate the termination control code by replicating and reflecting the deterioration of the transistors in the termination circuit, thereby improving impedance matching characteristics while improving signal integrity (SI) characteristics.

Meanwhile, although the embodiment explains that the on-resistance Ron may be compensated by using the stress replica circuit 130 replicating the deteriorated characteristics of the PMOS transistors in the pull-up termination circuit 112 when the PMOS transistors are deteriorated due to the NBTI stress, the present invention is not limited thereto. Depending on an embodiment, when NMOS transistors in the pull-down termination circuit 114 are deteriorated due to positive bias temperature instability (PBTI) stress, an on-resistance Ron may be compensated by using a stress replica circuit replicating the deteriorated characteristics of the NMOS transistors in the pull-down termination circuit 114.

It should be noted that although the technical spirit of the disclosure has been described in connection with preferred embodiments thereof, this is merely for description purposes and should not be interpreted as limiting. It should be appreciated by one of ordinary skill in the art that various changes may be made thereto without departing from the technical spirit of the disclosure.

For example, for the logic gates and transistors provided as examples in the above-described embodiments, different positions and kinds may be implemented depending on the polarity of the input signal.

What is claimed is:

1. A semiconductor device, comprising:
   at least one first resistor group coupled to a first pad and suitable for providing a first impedance according to a first control code during a first operation;
   at least one second resistor group coupled to the first pad and suitable for providing a second impedance according to a second control code during any of the first operation and a second operation;
   a stress replica circuit suitable for replicating a stress applied to the second resistor group during the second operation and for generating a detection code during a second calibration mode; and
   a calibration circuit suitable for adjusting the first control code to match an impedance of a resistor part coupled to a second pad to an external resistor during a first calibration mode and for generating is the second control code by adjusting the first control code according to the detection code during the second calibration mode.

2. The semiconductor device of claim 1,
   wherein the stress replica circuit includes a pull-up replica transistor and a pull-down replica transistor coupled in series between a source voltage terminal and a ground voltage terminal, and wherein the stress replica circuit is further suitable for:
applying a stress to the pull-up replica transistor by turning on only the pull-up replica transistor according to a second termination enable signal for activating the second resistor group, and
generating the detection code representing a replica impedance formed by turning on the pull-up replica transistor and the pull-down replica transistor during the second calibration mode.

3. The semiconductor device of claim 1, wherein the stress replica circuit includes:
a pull-up replica transistor and a pull-down replica transistor coupled in series between a source voltage terminal and a ground voltage terminal and suitable for respectively receiving a first replica control signal and a second replica control signal through their gates;
a replica control circuit suitable for enabling the first replica control signal during the second operation and enabling both the first replica control signal and the second replica control signal during the second calibration mode; and
an analog-digital converter suitable for converting a signal at a common node between the pull-up replica transistor and the pull-down replica transistor to output the detection code during the second calibration mode.

4. The semiconductor device of claim 1,
wherein the stress replica circuit includes a pull-up replica transistor and a pull-down replica transistor coupled in series between a source voltage terminal and a ground voltage terminal, and
wherein the stress replica circuit is further suitable for:
applying a stress to the pull-down replica transistor by turning on only the pull-down replica transistor according to a second termination enable signal for activating the second resistor group, and
generating the detection code representing a replica impedance formed by turning on the pull-up replica transistor and the pull-down replica transistor during the second calibration mode.

5. The semiconductor device of claim 1, wherein the stress replica circuit includes:

a pull-up replica transistor and a pull-down replica transistor coupled in series between a source voltage terminal and a ground voltage terminal and suitable for respectively receiving a first replica control signal and a second replica control signal through their gates;
a replica control circuit suitable for enabling the first second control signal during the second operation and enabling both the first replica control signal and the second replica control signal during the second calibration mode; and
an analog-digital converter suitable for converting a signal at a common node between the pull-up replica transistor and the pull-down replica transistor to output the detection code during the second calibration mode.

6. The semiconductor device of claim 1, wherein the first calibration circuit includes:
the resistor part coupled to the second pad and suitable for providing an impedance according to the first control code;
a comparator suitable for generating an up/down signal by comparing a voltage of the second pad with a reference voltage; and
a counter enabled according to a first mode signal indicating the first calibration mode and suitable for adjusting a value of the first control code in response to the up/down signal.

7. The semiconductor device of claim 1, wherein the second calibration circuit includes:
a deterioration determination part suitable for generating an adjusting code for determining a degree of deterioration of transistors according to the detection code during the second calibration mode; and
a code adjusting part suitable for generating the second control code by reflecting the adjusting code onto the first control code.

8. The semiconductor device of claim 1, wherein the first pad includes a data input/output pad and the second pad includes a calibration pad coupled to the external resistor.

* * * * *